United States Patent
Lee et al.

(10) Patent No.: US 9,860,990 B1
(45) Date of Patent: Jan. 2, 2018

(54) CIRCUIT BOARD STRUCTURE WITH CHIPS EMBEDDED THEREIN AND MANUFACTURING METHOD THEREOF

(71) Applicant: BOARDTEK ELECTRONICS CORPORATION, Taoyuan (TW)

(72) Inventors: Chien-Cheng Lee, Taoyuan (TW); Wen-Feng Cheng, Taipei (TW); Chung-Hsing Liao, Taoyuan County (TW)

(73) Assignee: BOARDTEK ELECTRONICS CORPORATION, Taoyuan (TW)

( * ) Notice: Subject to any disclaimer, the term of this patent is extended or adjusted under 35 U.S.C. 154(b) by 0 days.

(21) Appl. No.: 15/393,633

(22) Filed: Dec. 29, 2016

(30) Foreign Application Priority Data

Sep. 2, 2016 (TW) .............................. 105128453 A

(51) Int. Cl.
| | |
|---|---|
| *H05K 1/18* | (2006.01) |
| *H05K 3/46* | (2006.01) |
| *H05K 1/02* | (2006.01) |
| *H05K 3/40* | (2006.01) |
| *H05K 3/32* | (2006.01) |
| *H05K 3/06* | (2006.01) |
| *H05K 3/00* | (2006.01) |

(52) U.S. Cl.
CPC ........... *H05K 1/185* (2013.01); *H05K 1/0203* (2013.01); *H05K 1/0268* (2013.01); *H05K 1/0298* (2013.01); *H05K 3/0097* (2013.01); *H05K 3/06* (2013.01); *H05K 3/32* (2013.01); *H05K 3/40* (2013.01); *H05K 3/4641* (2013.01); *H05K 3/4697* (2013.01); *H05K 2201/066* (2013.01); *H05K 2201/10522* (2013.01); *H05K 2203/0228* (2013.01); *H05K 2203/16* (2013.01)

(58) Field of Classification Search
USPC .......................................... 361/761, 760, 762
See application file for complete search history.

(56) References Cited

U.S. PATENT DOCUMENTS

| 2008/0192450 A1* | 8/2008 | Tuominen | ........... H01L 23/5389 361/761 |
| 2015/0131248 A1* | 5/2015 | Dakhiya | ............. H01L 23/5384 361/761 |

* cited by examiner

*Primary Examiner* — Andargie M Aychillhum
(74) *Attorney, Agent, or Firm* — Li & Cai Intellectual Property (USA) Office

(57) ABSTRACT

A circuit board structure with chips embedded therein includes a multi-layer board and a power module embedded in the multi-layer board. The power module includes an insulating material, a power unit covered by the insulating material, and a circuit layer disposed on the insulating material. The power unit includes an electrically and thermally conductive carrier and a plurality of power chips. The electrically and thermally conductive carrier includes a transmitting portion and a carrying portion perpendicularly connected to the transmitting portion. Each power chip has a first electrode layer and an opposite second electrode layer. The first electrode layers are fixed on and electrically connected to the carrying portion in parallel, and the power chips are disposed at one side of the transmitting portion. The circuit layer is electrically connected to the electrically and thermally conductive carrier and the second electrode layers.

7 Claims, 22 Drawing Sheets

CIRCUIT BOARD STRUCTURE WITH CHIPS EMBEDDED THEREIN AND MANUFACTURING METHOD THEREOF

BACKGROUND OF THE INVENTION

1. Field of the Invention

The instant invention relates to a power component; in particular, to a circuit board structure with chips embedded therein and a manufacturing method thereof.

2. Description of Related Art

A conventional circuit board structure of an electronic device is usually provided with a power chip embedded therein for reducing the size and increasing the power supplying efficiency of the electronic device. However, the power chip (e.g., high-power chip) cannot be individually tested, so the power chip needs to be embedded in the conventional circuit board structure for using a plurality of conductive lines of the conventional circuit board structure to test the power chip. Specifically, the conductive lines are formed by filling conductive material into a plurality of thru-holes of the conventional circuit board structure, but the conductive lines connected to the electrodes of the power chip are formed without considering a heat-dissipating function, so heat energy generated from the power chip cannot efficiently be dissipated through the conductive lines. Moreover, if the power chip embedded in the conventional circuit board structure has a defect after testing, the conventional circuit board cannot be used.

SUMMARY OF THE INVENTION

The instant disclosure provides a circuit board structure with chips embedded therein and a manufacturing method thereof for effectively solving the problem caused by conventional circuit board structures.

The instant disclosure provides a circuit board structure with chips embedded therein, comprising: at least one power module including: an insulating material having a first surface and an opposite second surface; a power unit at least partially covered by the insulating material, and the power unit including: an electrically and thermally conductive carrier having a transmitting portion and a carrying portion perpendicularly connected to the transmitting portion; and a plurality of power chips each having a first electrode layer and an opposite second electrode layer, wherein the first electrode layers are fixed on and electrically connected to the carrying portion in parallel, and the power chips are arranged at one side of the transmitting portion; and a circuit layer disposed on the first surface of the insulating material, wherein the circuit layer is electrically connected to the electrically and thermally conductive carrier and the power chips, so the power chips of the at least one power module are configured to be individually tested through the circuit layer and the electrically and thermally conductive carrier; and a multi-layer board, wherein the at least one power module is embedded in the multi-layer board after testing to ensure that the at least one power module is provided without any defect.

The instant disclosure also provides a manufacturing method of a circuit board structure with chips embedded therein, comprising: providing a laminated board, wherein the laminated board includes an insulating layer, a first metal layer, and a second metal layer having a thickness less than that of the first metal layer, and the first metal layer and the second metal layer are respectively disposed on two opposite surfaces of the insulating layer; forming a plurality of sets of connecting columns to connect the first metal layer and the second metal layer, wherein the sets of the connecting columns are separately embedded in the insulating layer; removing part of the second metal layer to form a plurality of connecting pads, and removing part of the insulating layer to form a plurality of insulating supports, thereby forming a plurality of carrying surfaces of the first metal layer without connecting the insulating supports, wherein the connecting pads are respectively disposed on the insulating supports, and the sets of the connecting columns are respectively connected to the connecting pads and are respectively embedded in the insulating supports; using each of the carrying surfaces to mount a set of power chips for establishing an electrical connection between the sets of the power chips and the first metal layer; forming an insulating material to cover the sets of the power chips, the insulting supports, and the connecting pads; forming a plurality of circuit layers on the insulating material, wherein each of the circuit layers is connected to one of the connecting pads and one of the sets of the power chips; sawing the insulating material and the metal layer to form a plurality of power modules, wherein in each of the power modules, part of the sawed first metal layer, the connecting column connected to the part of the sawed first metal layer, and the connecting pad connected to the part of the sawed first metal layer are defined as an electrically and thermally conductive carrier, the part of the sawed first metal layer is defined as a carrying portion of the electrically and thermally conductive carrier, and the connecting column and the connecting pad connected to the part of the sawed first metal layer are defined as a transmitting portion of the electrically and thermally conductive carrier; testing the power chips of each of the power modules to select at least part of the power modules without any defect; and embedding the at least part of the power modules into a plurality of concavities of a multi-layer board to form a circuit board structure with chips embedded therein.

The instant disclosure further provides a manufacturing method of a circuit board structure with chips embedded therein, comprising: installing a plurality sets of power chips on a carrying plate, wherein the carrying plate has a first metal layer, and the sets of the power chips are fixed on and electrically connected to the first metal layer; forming an insulating material on the first metal layer to cover the sets of the power chips; forming a second metal layer on a surface of the insulating material arranged away from the first metal layer, and forming a plurality of sets of connecting columns in the insulating material, wherein the second metal layer is electrically connected to the sets of the power chips, the sets of the connecting columns connect the first metal layer and the second metal layer, and the sets of the connecting columns are arranged away from each other and are respectively corresponding in position to the sets of the power chips; etching the second metal layer to form a plurality of circuit layers, wherein each of the circuit layers is connected to one of the sets of the connecting columns and the corresponding set of the power chips; sawing the insulating material and the carrying plate to form a plurality of power modules, wherein in each of the power modules, part of the sawed first metal layer and the connecting column connected to the part of the sawed first metal layer are defined as an electrically and thermally conductive carrier, the part of the sawed first metal layer is defined as a carrying portion of the electrically and thermally conductive carrier, and the connecting column connected to the part of the sawed first metal layer is defined as a transmitting portion of the electrically and thermally conductive carrier; testing the power chips of each of the power modules to select at least part of the power modules without any defect; and embedding the at least part of the power modules into a plurality of concavities of a multi-layer board to form a circuit board structure with chips embedded therein.

In summary, the circuit board structure and the manufacturing method thereof each provides an electrically and thermally conductive carrier for transmitting heat-energy and electrical-energy at the same time, so the heat-energy and electrical-energy generated from each power chip can be transmitted rapidly by mounting on the electrically and thermally conductive carrier. Moreover, each power chip is embedded in the insulating material for isolating an external interference, and the circuit layer and the electrically and thermally conductive carrier are configured to transmit voltage or current, so each power chip can receive a predetermined testing voltage or current. Accordingly, before each power module is embedded in the multi-layer board, the power chips can be individually tested for insuring that the chips embedded in the circuit board structure are provided without any defect.

In order to further appreciate the characteristics and technical contents of the instant invention, references are hereunder made to the detailed descriptions and appended drawings in connection with the instant invention. However, the appended drawings are merely shown for exemplary purposes, rather than being used to restrict the scope of the instant invention.

DETAILED DESCRIPTION OF THE PREFERRED EMBODIMENTS

First Embodiment

Please refer to FIGS. 1A through 6, which show a first embodiment of the instant disclosure. References are hereunder made to the detailed descriptions and appended drawings in connection with the instant invention. However, the appended drawings are merely shown for exemplary purposes, rather than being used to restrict the scope of the instant invention.

Figure 1A:
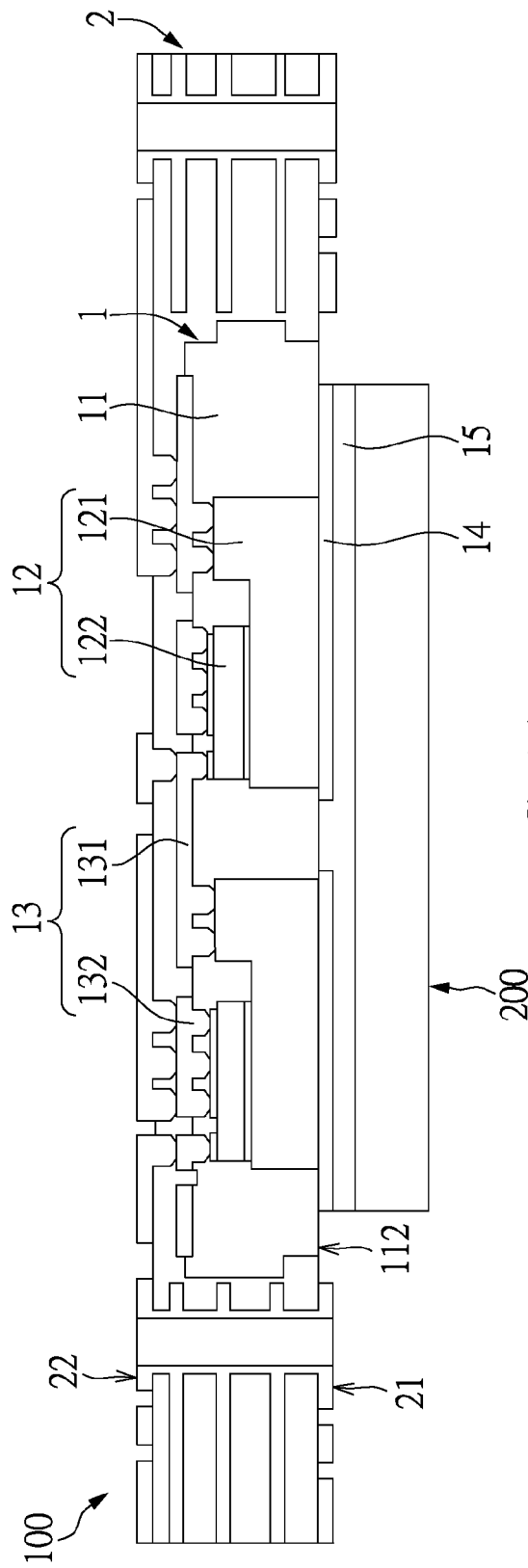
FIG. 1A is a cross-sectional view showing a circuit board structure with chips embedded therein adhered to a heat-transmitting member according to a first embodiment of the instant disclosure.

Please refer to FIG. 1A, which shows a circuit board structure 100 with chips embedded therein, in particular to a circuit board structure 100 with high-power chips embedded therein, but the instant disclosure is not limited thereto. The circuit board structure 100 includes at least one power module 1 and a multi-layer board 2, and the at least one power module 1 is embedded in the multi-layer board 2. It should be noted that the circuit board structure 100 can be provided with a plurality of power modules 1 embedded in the multi-layer board 2, or the power module 1 can be applied to another device. The following description discloses the construction of each of the power module 1 and the multi-layer board 2, and then discloses the related features of the power module 1 and the multi-layer board 2.

Figure 2:
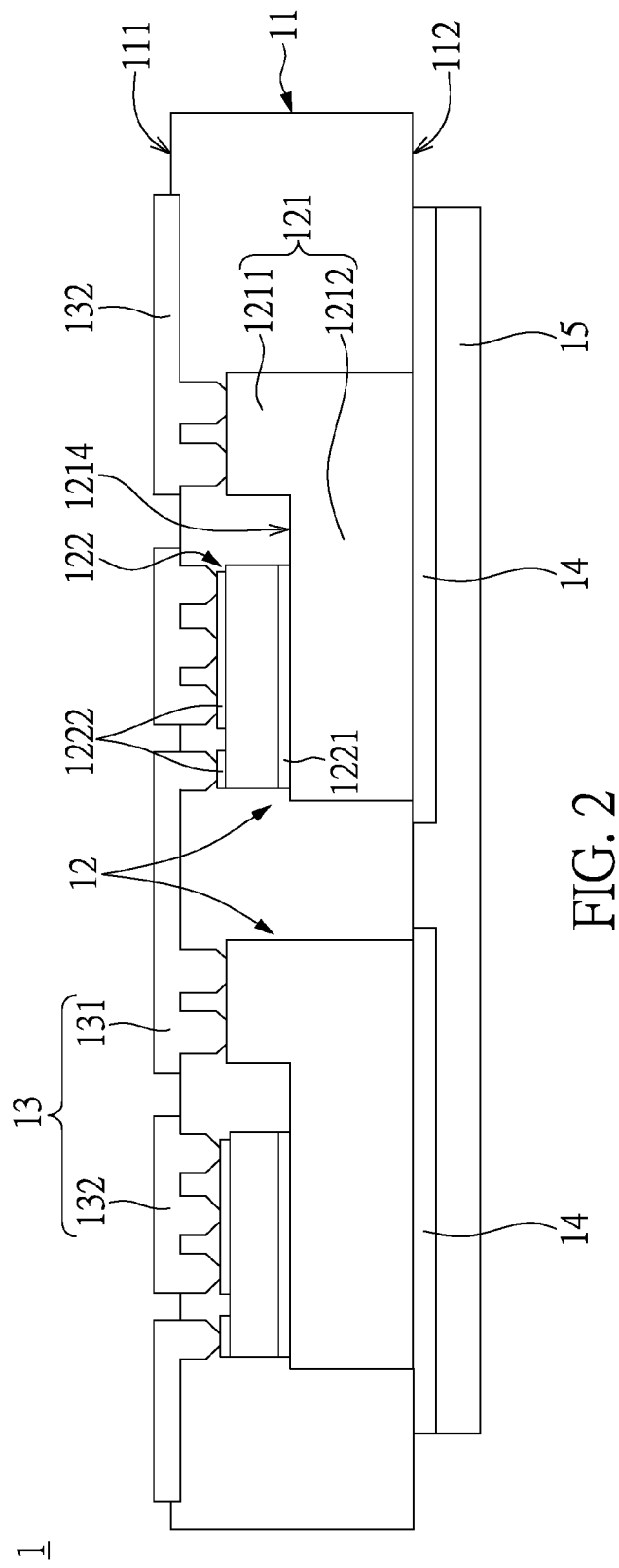
FIG. 2 is a cross-sectional view showing a power module according to the instant disclosure.
Figure 3:
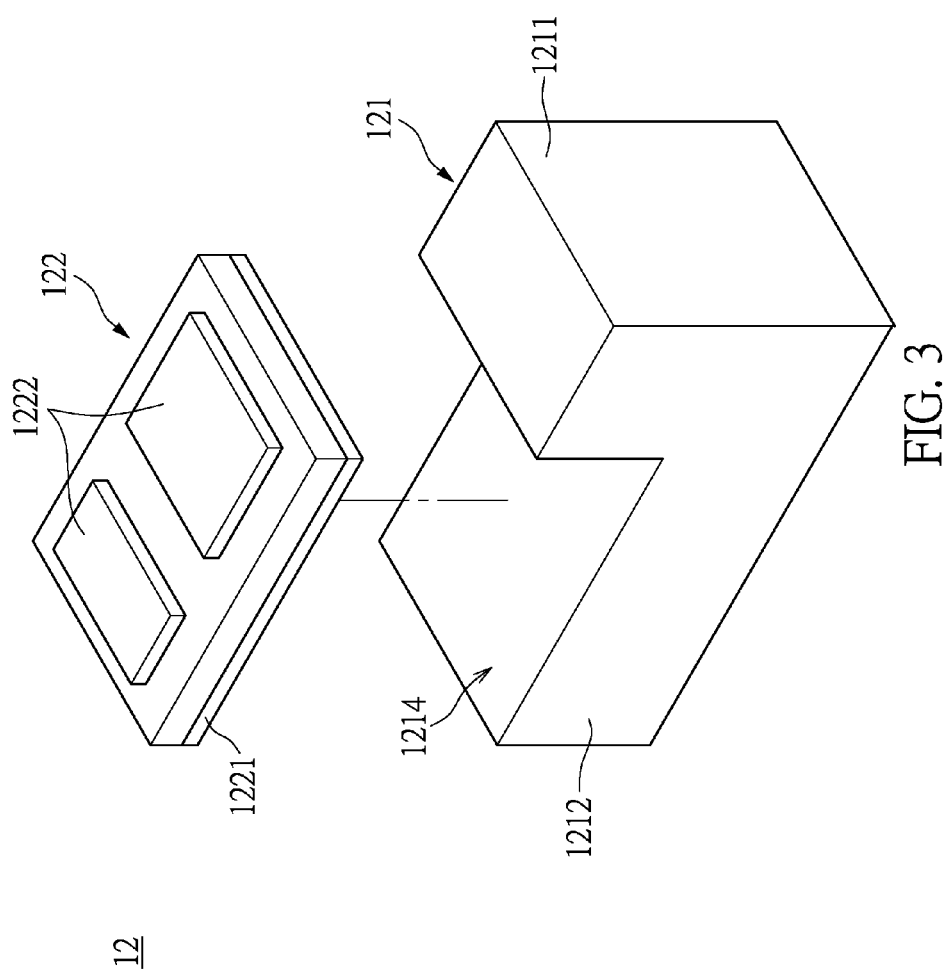
FIG. 3 is a perspective view showing a power unit of FIG. 2.

As shown in FIGS. 2 and 3, the power module 1 includes an insulating material 11, two power units 12 embedded in the insulating material 11 and arranged apart from each other, a circuit layer 13, and a metal layer 14. The circuit layer 13 and the metal layer 14 are disposed on two opposite surfaces of the insulating material 11. The insulating material 11 in the instant embodiment is a plate-like construction and is preferably provided with a high heat-dissipating rate, but the instant disclosure is not limited thereto. The insulating material 11 has a first surface 111 (i.e., the top surface of the insulating material 11 shown in FIG. 2) and an opposite second surface 112 (i.e., the bottom surface of the insulating material 11 shown in FIG. 2).

Figure 1B:
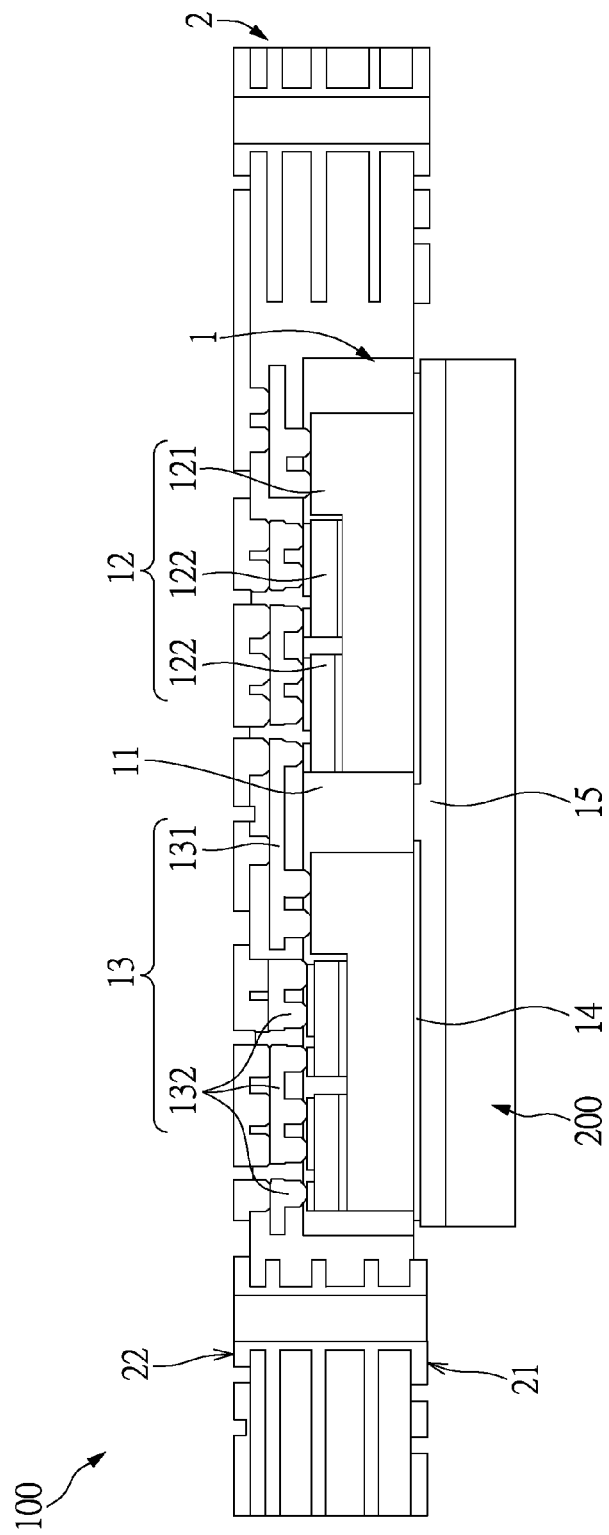
FIG. 1B is a cross-sectional view showing a variety of FIG. 1A.

Each power unit 12 includes an electrically and thermally conductive carrier 121 and at least one power chip 122 disposed on the electrically and thermally conductive carrier 121. The number of the at least one power chip 122 of each power unit 12 in the instant embodiment is one, but the instant disclosure is not limited thereto. For example, as shown in FIG. 1B, each power unit 12 includes an electrically and thermally conductive carrier 121 and a plurality of power chips 122 disposed on the electrically and thermally conductive carrier 121. The power units 12 are provided with identical constructions, so the following description only discloses one of the power units 12 for clearly explaining the instant embodiment.

The electrically and thermally conductive carrier 121 is an integral metal construction (i.e., copper) and includes a transmitting portion 1211 and a carrying portion 1212 perpendicularly connected to the transmitting portion 1211. The transmitting portion 1211 and the carrying portion 1212 in the instant embodiment are formed with an L-shaped construction. Each power chip 122 in the instant embodiment is preferably a high-power chip 122, which cannot be individually tested, and the high-power chip 122 can be applied with more than 5 KW, but the instant disclosure is not limited thereto. Moreover, the power chip 122 has a first electrode layer 1221 (i.e., the bottom layer of the power chip 122 shown in FIG. 2) and an opposite second electrode layer 1222 (i.e., the top layer of the power chip 122 shown in FIG. 2). The first electrode layer 1221 is fixed on and electrically connected to the carrying portion 1212, and the power chip 122 is disposed adjacent to the transmitting portion 1211. Each first electrode layer 1221 is a drain electrode, and each second electrode layer 1222 includes a source electrode and a gate electrode arranged apart from the source electrode.

Thus, the electrically and thermally conductive carrier 121 in the instant embodiment is configured to transmit heat energy and electrical energy, and the power chip 122 contacts the electrically and thermally conductive carrier 121, so the power chip 122 can transmit heat energy and electrical energy faster by using the electrically and thermally conductive carrier 121.

Specifically, a surface of the carrying portion 1212 used for mounting the power chip 122 is defined as a carrying surface 1214 (i.e., the top surface of the carrying portion 1212 shown in FIG. 3), and the area of the carrying surface 1214 is greater than or identical to that of a cross-section of the power chip 122. The cross-section of the power chip 122 in the instant embodiment is approximately parallel to the carrying surface 1214.

Thus, the first electrode layer 1221 of the power chip 122 is entirely connected to the carrying surface 1214, thereby effectively increasing a transmitting rate of heat energy and electrical energy between the power chip 122 and the carrying portion 1212. Moreover, a surface of the carrying portion 1212 arranged away from the power chip 122 (i.e., the bottom surface of the carrying portion 1212 shown in FIG. 2) is preferably coplanar with the second surface 112 of the insulating material 11. The second electrode layer 1222 of the power chip 122 and the transmitting portion 1211 are arranged close to the first surface 111.

It should be noted that the first electrode layer 1221 of the power chip 122 and the carrying portion 1212 of the electrically and thermally conductive carrier 121 in the instant embodiment are connected by using an electrically and thermally conductive metal. For example, the first electrode layer 1221 of the power chip 122 and the carrying portion 1212 of the electrically and thermally conductive carrier 121 in the instant embodiment are connected by using a silver sintering manner or a diffusion soldering manner.

Figure 4:
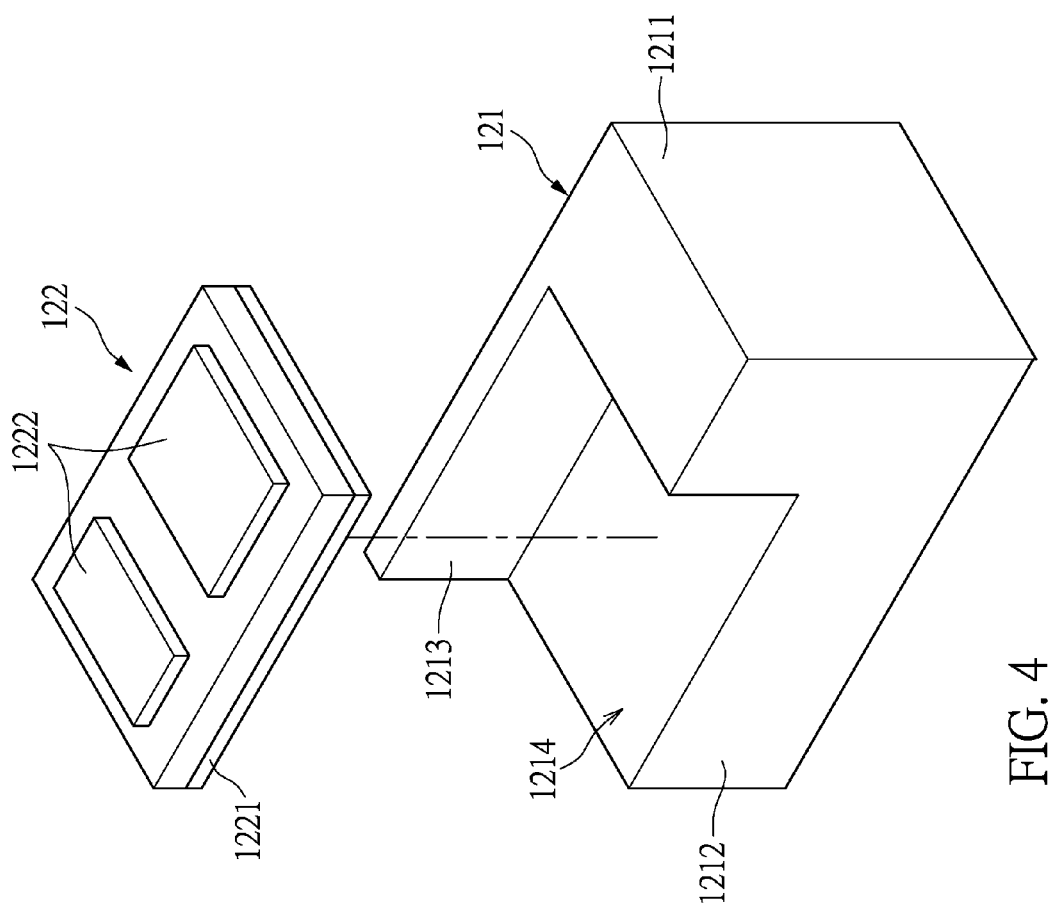
FIG. 4 is a perspective view showing a variety of the power unit of FIG. 2.

The construction of each power unit 12 has been disclosed in the above description, but the instant disclosure is not limited thereto. For example, as shown in FIG. 4, each electrically and thermally conductive carrier 121 further includes a side wall 1213 perpendicularly connected to the transmitting portion 1211 and the carrying portion 1212, and the power chip 122 is arranged in a space defined by the transmitting portion 1211, the carrying portion 1212, and the side wall 1213. The construction of the side wall 1213 can be changed according to designer's demand, and is not limited to FIG. 4.

Figure 5:
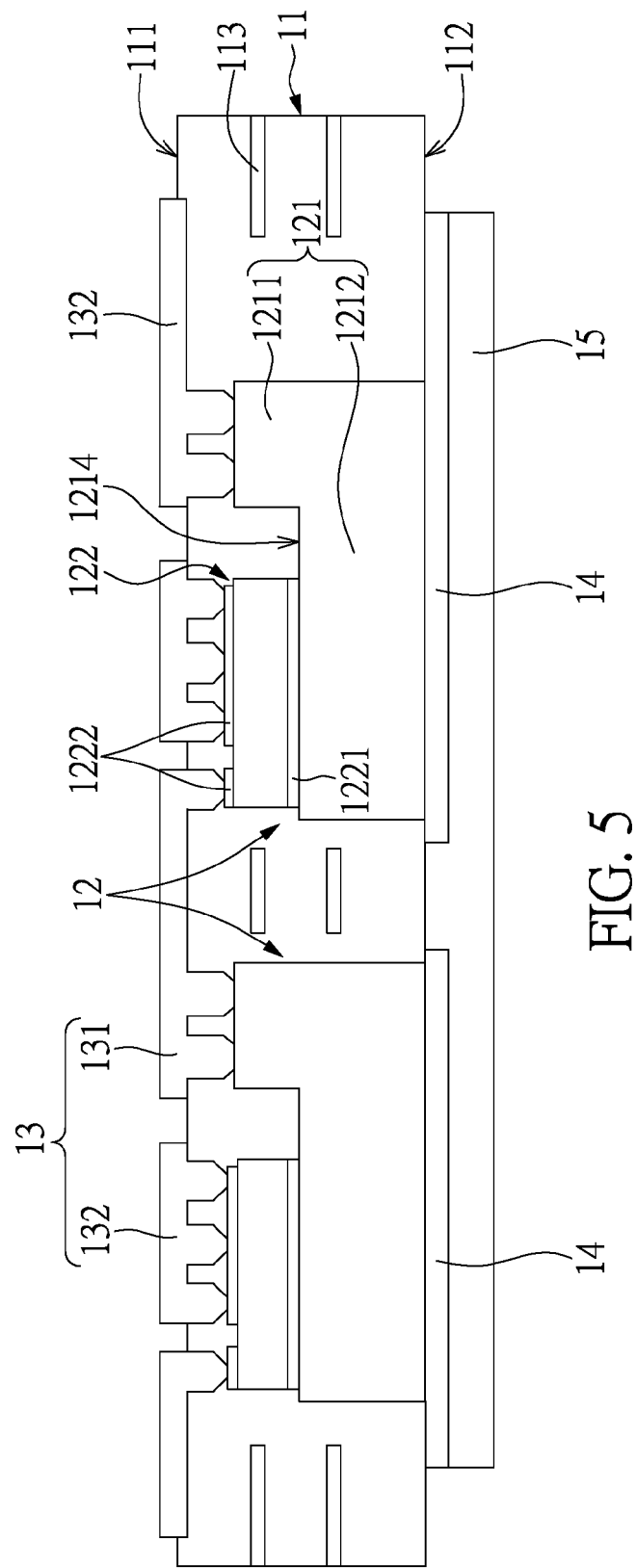
FIG. 5 is a cross-sectional view showing the power module, which has an electrically conductive layer embedded in the insulating material.

In addition, as shown in FIG. 5, at least one functional module (not shown) and at least one electrically conductive layer 113 connected to the functional module can be embedded in the insulating material 11, and the electrically conductive layer 113 is provided without contacting the electrically and thermally conductive carriers 121 and the power chips 122.

As shown in FIGS. 2 and 3, the circuit layer 13 is disposed on the first surface 111 of the insulating material 11. The circuit layer 13 is electrically connected to the two electrically and thermally conductive carriers 121 and the second electrode layers 1222 of the two power chips 122, so the power chips 122 of the power module 1 can be configured to be individually tested through the circuit layer 13 and the electrically and thermally conductive carriers 121. Specifically, when the power chip 122 is individually tested, an external interference generated from a cable or a mold could easily influence the testing of the power chip 122 such that the power chip 122 would not be able to receive a predetermined testing voltage or current. Thus, each power chip 122 in the instant embodiment is embedded in the insulating material 11 to isolate any external interference, and each power chip 122 receives a predetermined testing voltage or current by using the circuit layer 13 and the electrically and thermally conductive carrier 121. Before the power module 1 is embedded in the multi-layer board 2, the power module 1 can be tested to ensure that the power module 1 is provided without any defect.

Moreover, the circuit layer 13 has a connecting circuit 131 and two extending circuits 132. In the power module 1, the connecting circuit 131 connects the transmitting portion 1211 of one of the two power units 121 to the adjacent second electrode layer 1222 of the other power unit 121, and the transmitting portion 1211 and the second electrode layer 1222, which are not connected to the connecting circuit 131, are respectively connected to the two extending circuits 132, so the two power units 12 are electrically connected in parallel by using the circuit layer 13. In addition, a power module provided with only one power chip (not shown), differing from the power module 1 of the instant embodiment, is possible.

The connecting circuit 131 and the two extending circuits 132 are extended into the insulating material 11 to connect a portion of the transmitting portions 1211 arranged away from the second surface 112 (i.e., the top surface of each transmitting portion 1211 shown in FIG. 2) and the second electrode layers 1222. The two extending circuits 132 are configured to receive a testing voltage or to input/output a testing current.

Specifically, the circuit layer 13 can be formed by the following manner, but the instant disclosure is not limited thereto. A plurality of thru-holes (not labeled) are formed from the first surface 111 of the insulating material 11 to the transmitting portions 1211 and the second electrode layers 1222, and then a conductive material is filled (or coated) into the thru-holes and covers part of the first surfaces 111 arranged adjacent to the thru-holes, thereby forming the connecting circuit 131 and the two extending circuits 132.

Figure 6:
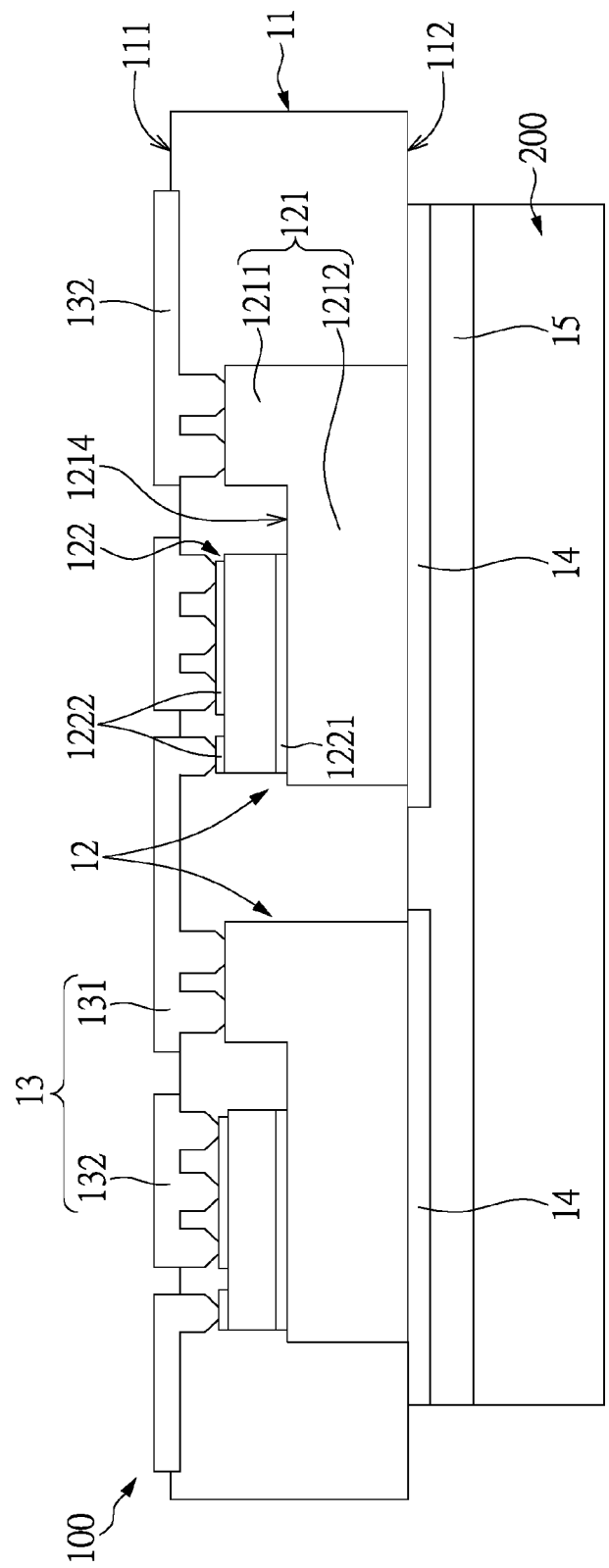
FIG. 6 is a cross-sectional view showing the power module adhered to the heat-transmitting member.

The metal layer 14 is disposed on the second surface 112 of the insulating material 11. The metal layer 14 has at least two separated portions, which are respectively integrally connected to the carrying portions 1212 of the two electrically and thermally conductive carriers 121. In addition, as shown in FIG. 6, the power module 1 can further include an insulating adhesive 15. The insulating adhesive 15 is disposed on the metal layer 14 and at least part of the second surface 112 of the insulating material 11 (i.e., a portion of the second surface 112 arranged between the two portions of the metal layer 14 shown in FIG. 6), such that the power module 1 can be adhered to a heat-transmitting member 200 by using the insulating adhesive 15.

In a non-shown embodiment, the electrically and thermally conductive carriers 121 can be made of ceramic material, and a conductive circuit is formed in the ceramic material for transmitting current. Specifically, the coefficient of expansion of the power unit 12 can be close to that of the adjacent material by using the ceramic material, and the two power chips 122 disposed on the ceramic material have a better electrical isolation effect.

As shown in FIG. 1A, the multi-layer board 2 has a first board surface 21 and an opposite second board surface 22. The multi-layer board 2 in the instant embodiment is a multi-layer circuit board formed by laminating a plurality of plates and forming a circuit layout. The power module 1 is embedded into the multi-layer board 2 from the first board surface 21 to construct the circuit board structure 100 of the instant embodiment. The second surface 112 of the insulating material 11 is exposed from the multi-layer board 2 through the first board surface 21, and the circuit board structure 100 can be adhered to the heat-transmitting member 200 by using the insulating adhesive 15.

Moreover, the insulating material 11 of the power module 1 can be different from the multi-layer board 2. For example, a heat-dissipating rate of the insulating material 11 can be better than that of the multi-layer board 2, thereby increasing the heat-dissipating rate of the circuit board structure 100 and improving a problem of the circuit board structure 100 (e.g., the multi-layer board 2 is bent or the power chip 122 is crushed) caused by thermal stress.

Second Embodiment

Figure 7:
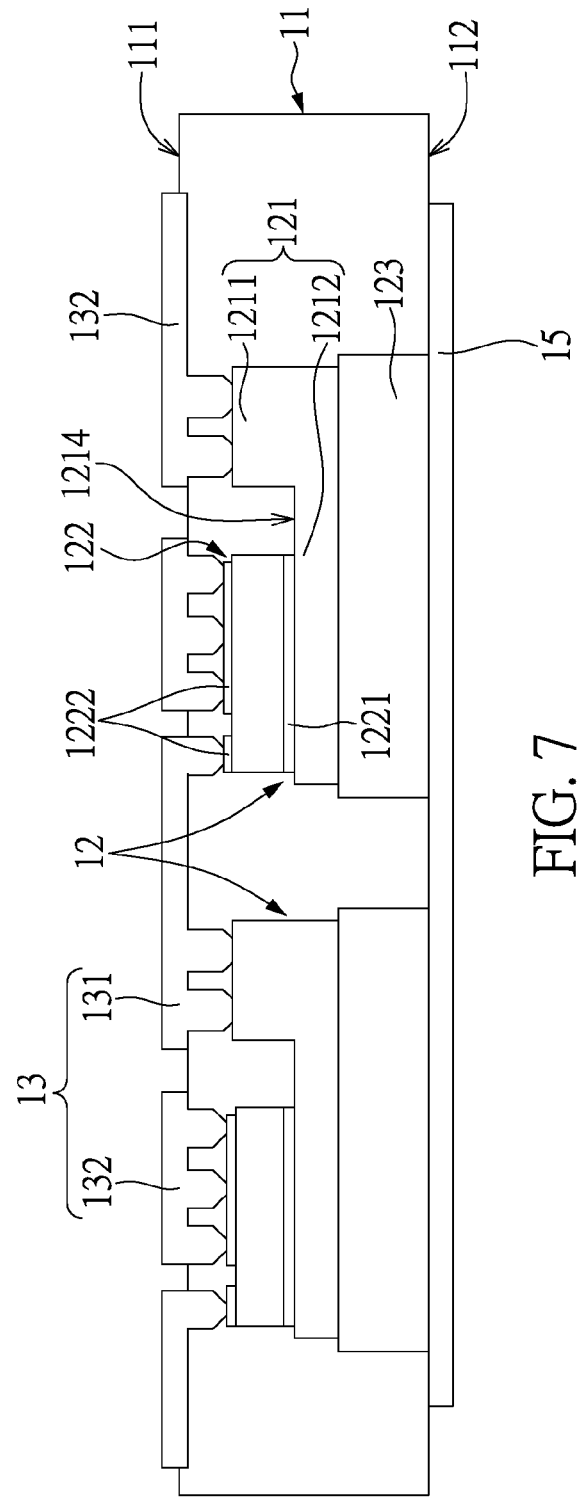
FIG. 7 is a cross-sectional view showing the power module according to a second embodiment of the instant disclosure.
Figure 8:
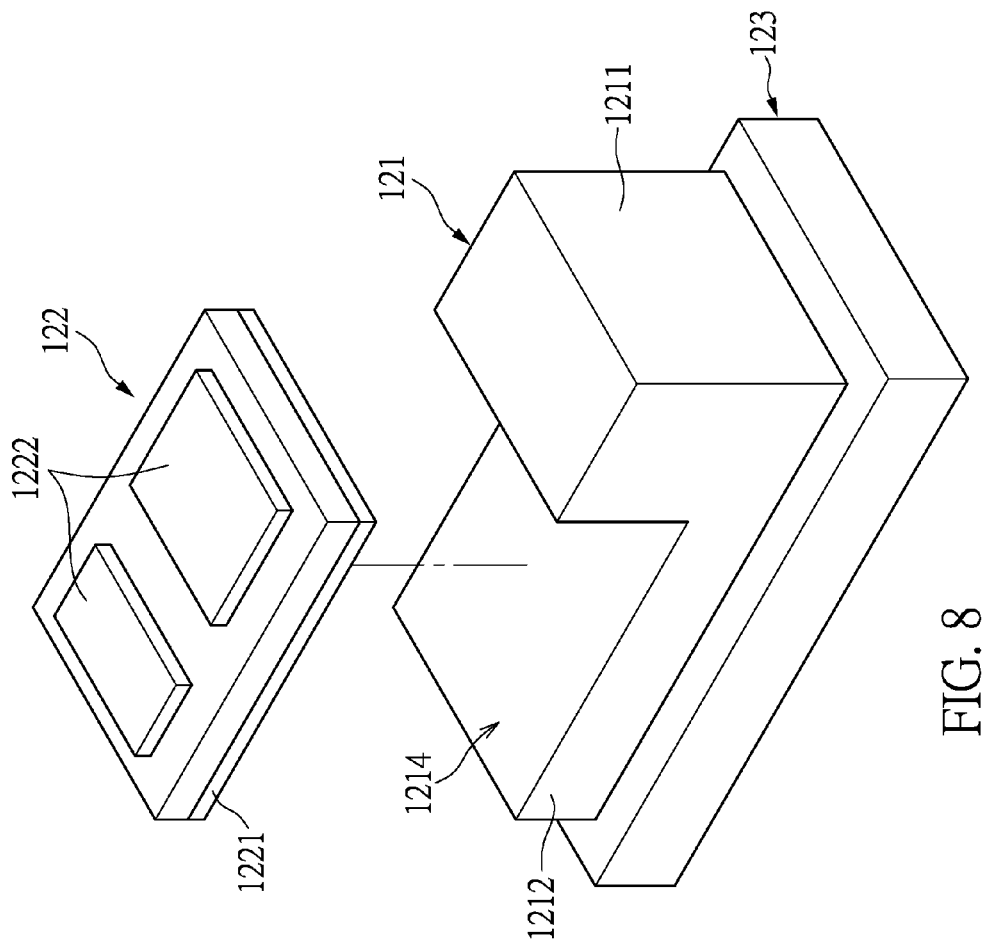
FIG. 8 is a perspective view showing the power unit of FIG. 7.

Please refer to FIGS. 7 and 8, which show a second embodiment of the instant disclosure. The second embodiment is similar to the first embodiment, and the identical features are not described. The different feature between the two embodiments is the power module 1.

The power module 1 in the instant embodiment is provided without the metal layer 14, and each power unit 12 further includes an insulating heat sink 123, which is made of ceramic material. In each power unit 12, the carrying portion 1212 of the electrically and thermally conductive carrier 121 is disposed on the insulating heat sink 123, and a surface of the insulating heat sink 123 arranged away from the power chip 122 is coplanar with the second surface 112 of the insulating material 11.

Specifically, a surface of the insulating heat sink 123 for mounting the electrically and thermally conductive carrier 121 is greater than the carrying surface 1214 of the carrying portion 1212, and the volume of the insulating heat sink 123 in the instant embodiment is more than that of the electrically and thermally conductive carrier 121, but the instant disclosure is not limited thereto. Moreover, the insulating adhesive 15 is disposed on the insulating heat sink 123 and part of the second surface 112 of the insulating material 11, thus the power module 1 can be adhered to a heat-transmitting member (not shown) by using the insulating adhesive 15.

Third Embodiment

Figure 9:
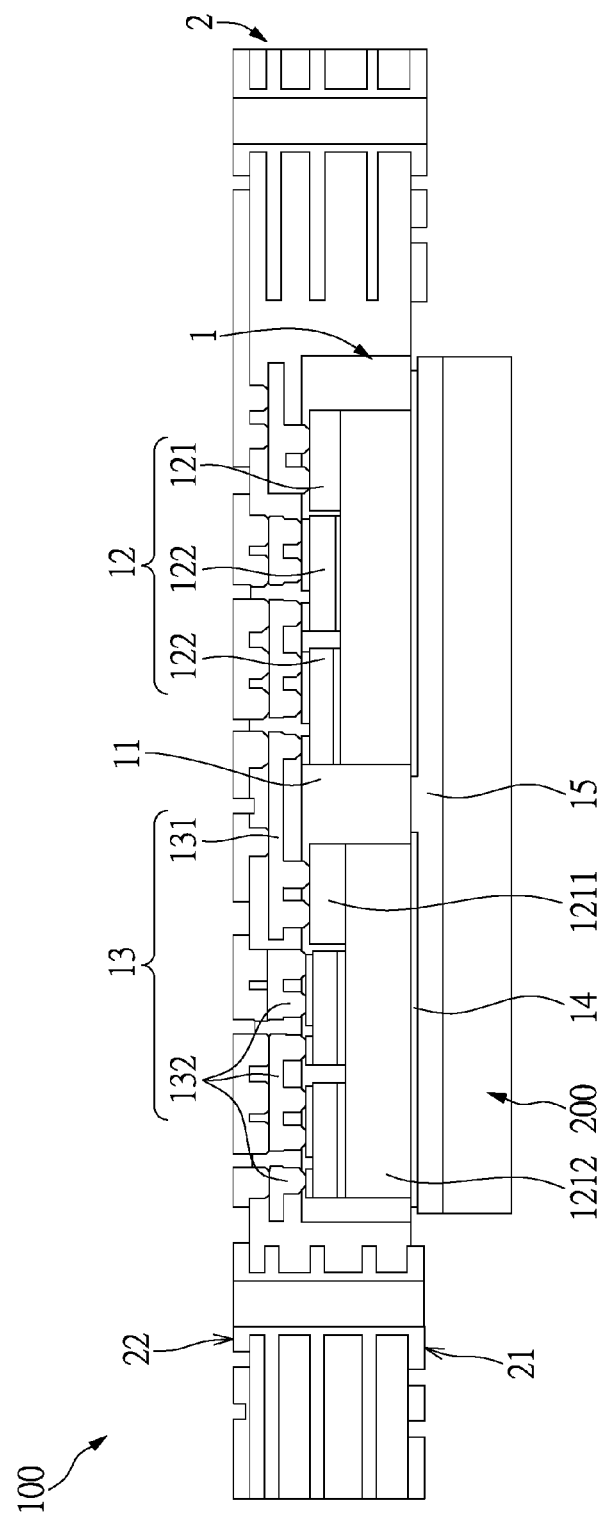
FIG. 9 is a cross-sectional view showing the power module according to a third embodiment of the instant disclosure.

Please refer to FIG. 9, which shows a third embodiment of the instant disclosure. The third embodiment is similar to the first embodiment, and the identical features are not described. The different feature between the two embodiments is the power module 1. Specifically, in the electrically and thermally conductive carrier 121, the transmitting portion 1211 is connected to the carrying portion 1212 by using a silver sintering manner or a diffusion soldering manner.

Fourth Embodiment

Please refer to FIGS. 10 through 16, which show a fourth embodiment of the instant disclosure. The fourth embodiment is similar to the first embodiment, and the identical features are not described. The different feature between the two embodiments is the power module 1. The following description discloses a manufacturing method of the circuit board structure 100 of the instant embodiment first for clearly explaining this different feature.

Figure 10:
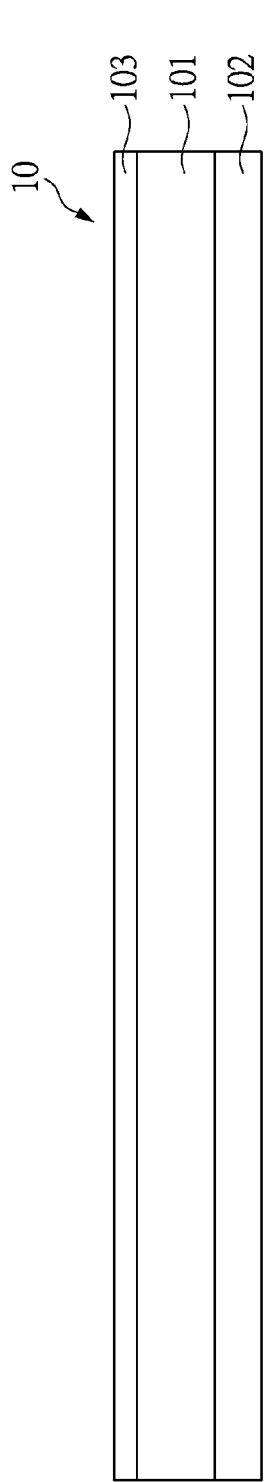
FIG. 10 is a cross-sectional view showing step S110 of a manufacturing method of the circuit board structure according to a fourth embodiment of the instant disclosure.

Please refer to FIG. 10, which shows a step S110 of the manufacturing method. A laminated board 10 is provided. The laminated board 10 includes an insulating layer 101, a first metal layer 102, and a second metal layer 103 having a thickness less than that of the first metal layer 102. The first metal layer 102 and the second metal layer 103 are respectively disposed on two opposite surfaces of the insulating layer 101. Specifically, the insulating layer 101 is preferably provided with a high heat-dissipating rate.

Figure 11:
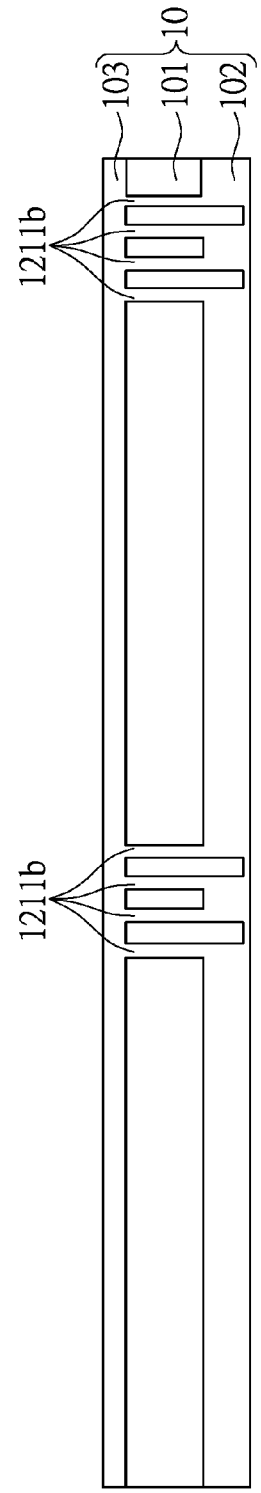
FIG. 11 is a cross-sectional view showing step S120 of the manufacturing method of the circuit board structure according to the fourth embodiment of the instant disclosure.

Please refer to FIG. 11, which shows a step S120 of the manufacturing method. A plurality of sets of connecting columns 1211b are formed to (perpendicularly) connect the first metal layer 102 and the second metal layer 103. The sets of the connecting columns 1211b are separately embedded in the insulating layer 101. Specifically, the laminated board 10 is drilled to form a plurality of holes, and then metal material is filled into or plated in the holes to form the connecting columns 1211b, but the instant disclosure is not limited thereto.

Figure 12:
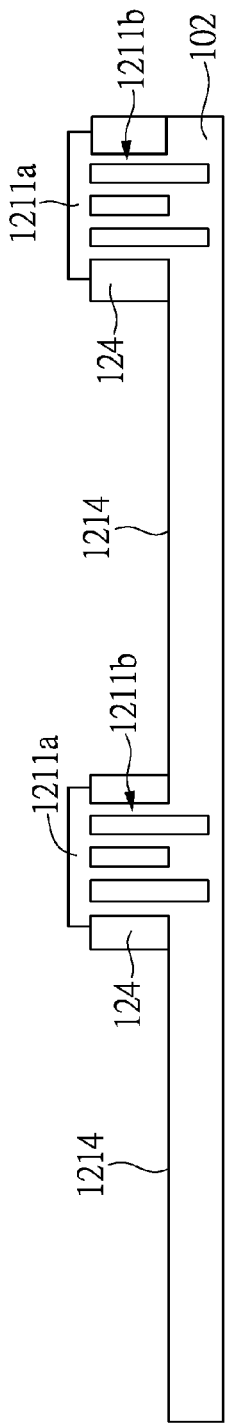
FIG. 12 is a cross-sectional view showing step S130 of the manufacturing method of the circuit board structure according to the fourth embodiment of the instant disclosure.

Please refer to FIG. 12, which shows a step S130 of the manufacturing method. Part of the second metal layer 103 is removed to form a plurality of connecting pads 1211a, and part of the insulating layer 101 is removed to form a plurality of insulating supports 124. Specifically, a plurality of carrying surfaces 1214 of the first metal layer 102 are formed without connecting the insulating supports 124. The connecting pads 1211a are respectively disposed on the insulating supports 124, and the sets of the connecting columns 1211b are respectively connected to the connecting pads 1211a and are respectively embedded in the insulating supports 124.

Figure 13:
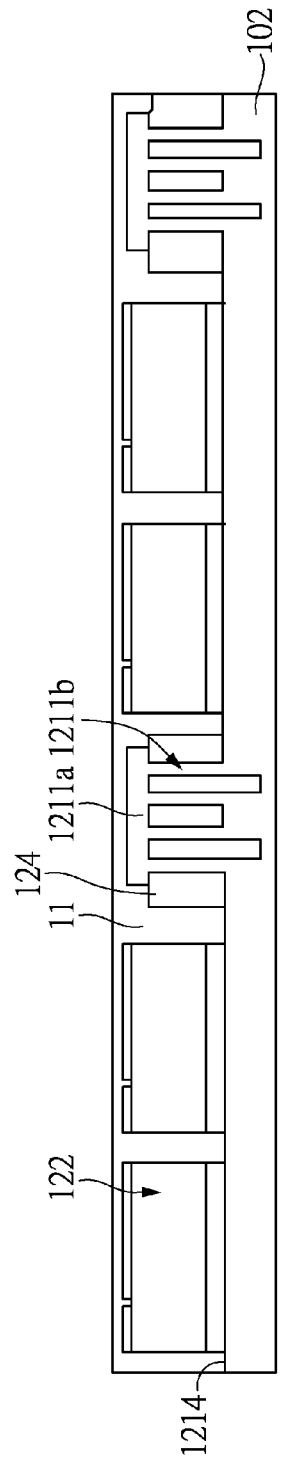
FIG. 13 is a cross-sectional view showing step S140 of the manufacturing method of the circuit board structure according to the fourth embodiment of the instant disclosure.

Please refer to FIG. 13, which shows a step S140 of the manufacturing method. Each of the carrying surfaces 1214 is used to mount a set of power chips for establishing an electrical connection between the sets of the power chips 122 and the first metal layer 102, and an insulating material 11 is formed on the carrying surfaces 1214 to cover the sets of the power chips 122, the insulting supports 124, and the connecting pads 1211a. That is to say, the sets of the power chips 122, the insulting supports 124, and the connecting pads 1211a are embedded in the insulating material 11.

Figure 14:
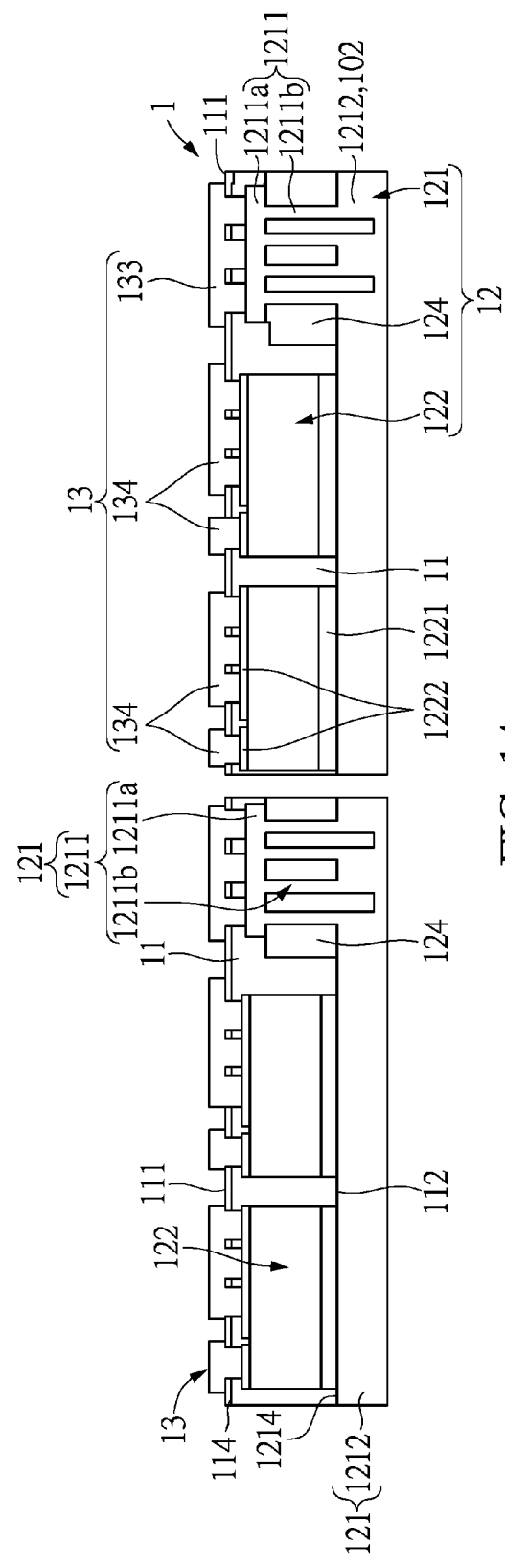
FIG. 14 is a cross-sectional view showing steps S150 and S160 of the manufacturing method of the circuit board structure according to the fourth embodiment of the instant disclosure.

Please refer to FIG. 14, which shows a step S150 of the manufacturing method. A plurality of circuit layers 13 are formed on the insulating material 11 and are connected to the connecting pads 1211a and the sets of the power chips 122. In other words, each of the circuit layers 13 is connected to one of the connecting pads 1211a and one of the sets of the power chips 122.

It should be noted that the insulating material 11 in the instant embodiment can be provided with a bonding layer 114 arranged away from the first metal layer 102 for bonding the circuit layers 13, and an outer surface of the bonding layer 114 can be regarded as the first surface 111 of the insulating material 11.

Please refer to FIG. 14, which shows a step S160 of the manufacturing method. The insulating material 11 and the metal layer 102 are sawed to form a plurality of power modules 1, and the sawed portions of the insulating material 11 and the metal layer 102 are located at the right side of each insulating support 124 shown in FIG. 14. The number of the power modules 1 in the instant embodiment is two for example, but the instant disclosure is not limited thereto. Thus, the power module 1 can be produced in mass by implementing the above steps S110~S160, thereby increasing the producing rate of the power module 1.

In each of the power modules 1, an electrically and thermally conductive carrier 121 includes part of the sawed first metal layer 102, the connecting columns 1211b connected to the part of the sawed first metal layer 102, and the connecting pad 1211a connected to the part of the sawed first metal layer 102. A carrying portion 1212 of the electrically and thermally conductive carrier 121 includes the part of the sawed first metal layer 102. A transmitting portion 1211 of the electrically and thermally conductive carrier 121 includes the connecting columns 1211b and the connecting pad 1211a connected to the part of the sawed first metal layer 102.

Figure 15:
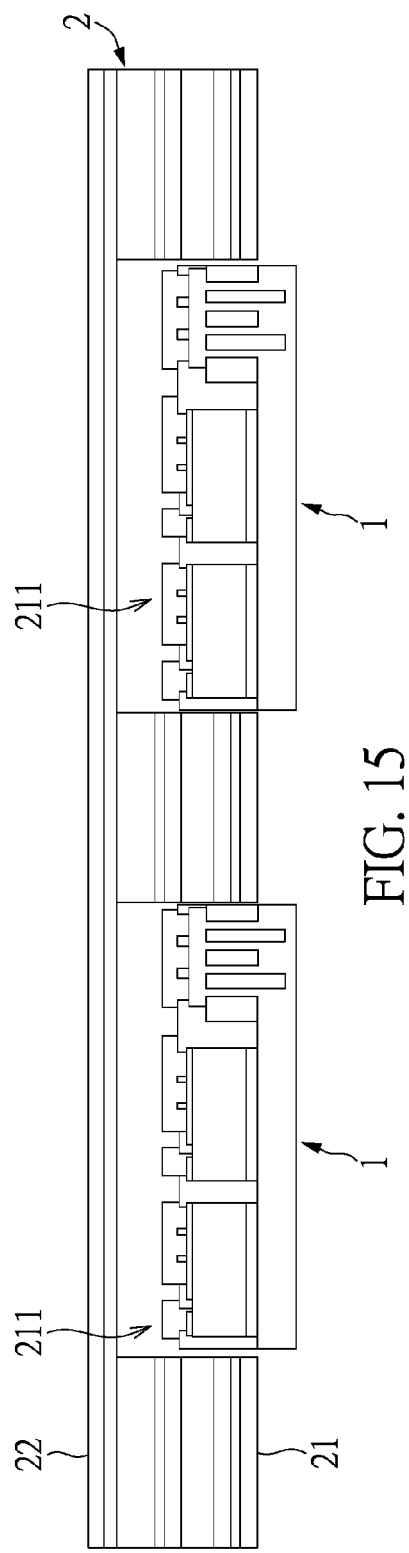
FIG. 15 is a first cross-sectional view showing step S170 of the manufacturing method of the circuit board structure according to the fourth embodiment of the instant disclosure.
Figure 16:
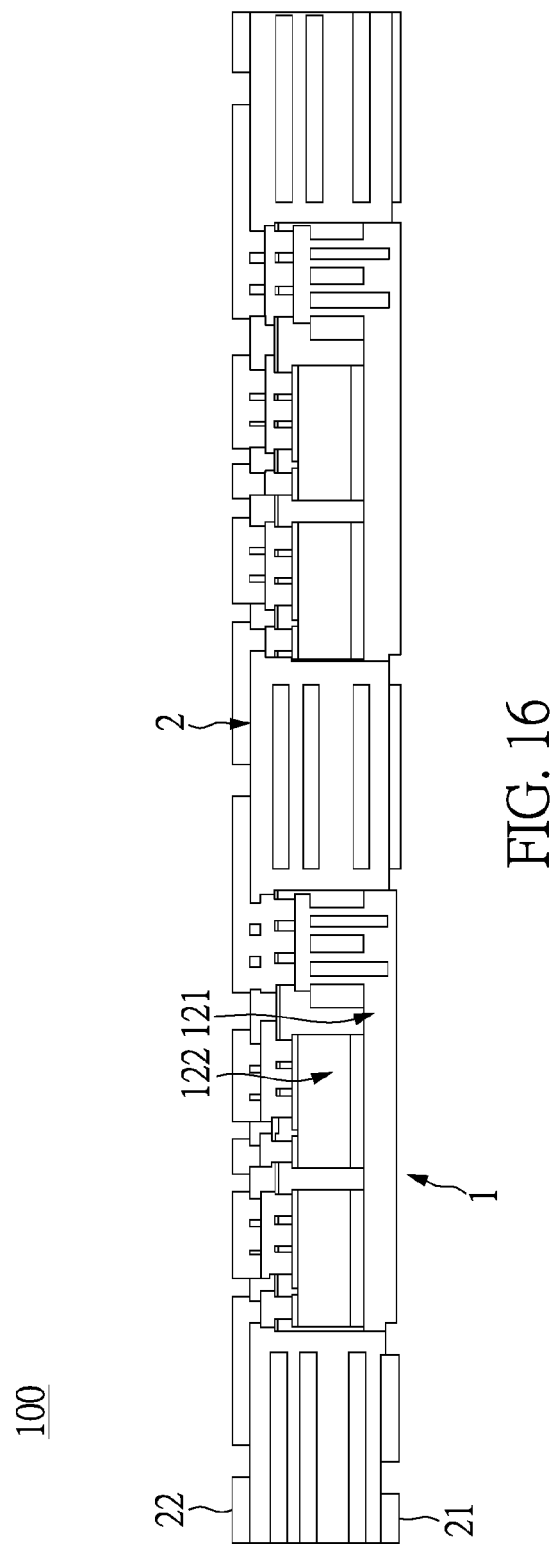
FIG. 16 is a second cross-sectional view showing step S170 of the manufacturing method of the circuit board structure according to the fourth embodiment of the instant disclosure.

Please refer to FIGS. 15 and 16, which show a step S170 of the manufacturing method. The power chips 122 of each of the power modules 1 are tested to select the at least part of the power modules 1 without any defect, and the at least part of power modules 1 are embedded into a plurality of concavities 211 of a multi-layer board 2 to form a circuit board structure 100 with chips embedded therein. Moreover, the second board surface 22 of the multi-layer board 2 can be provided with a circuit electrically connected to the power modules 1. Thus, the circuit board structure 100 of the instant embodiment can be produced by implementing the above steps S110~S170.

The manufacturing method of the circuit board structure 100 of the instant embodiment has been disclosed in the above description, and the following description simply discloses the circuit board structure 100 produced by using the manufacturing method. Part of the circuit board structure 100 of the instant embodiment is identical to that of the first embodiment, the second embodiment, and the third embodiment, so the identical features can be referenced in the first embodiment, the second embodiment, and the third embodiment.

As shown in FIG. 16, the circuit board structure 100 includes a multi-layer board 2 and at least one power module 1 embedded in the multi-layer board 2. The number of the at least one power module 1 embedded in the multi-layer board 2 in the instant embodiment is two, but the instant disclosure is not limited thereto. Moreover, the power modules 1 have the same construction, so the following description only discloses one of the power modules 1.

As shown in FIG. 14, the power module 1 includes an insulating material 11, a power unit 12 at least partially covered by the insulating material 11, and a circuit layer 13 disposed on the insulating material 11. The insulating material 11 has a first surface 111 and an opposite second surface 112. The power unit 12 includes an electrically and thermally conductive carrier 121, an insulating support 124 covering part of the electrically and thermally conductive carrier 121, and a plurality of power chips 122 disposed on the electrically and thermally conductive carrier 121.

The electrically and thermally conductive carrier 121 includes a plate-like carrying portion 1212 and a transmitting portion 1211 perpendicularly connected to the carrying portion 1212. The transmitting portion 1211 includes a connecting pad 1211a and a plurality of connecting columns 1211b connecting the carrying portion 1212 and the connecting pad 1211a. The insulating support 124 is arranged between the connecting pad 1211a and the carrying portion 1212, and the connecting columns 1211b are embedded in the insulating support 124.

Each power chip 122 includes a first electrode layer 1221 and an opposite second electrode layer 1222. Each first electrode layer 1221 in the instant embodiment is a drain electrode, and each second electrode layer 1222 includes a source electrode and a gate electrode arranged apart from the source electrode. The first electrodes 1221 of the power chips 122 are fixed on and electrically connected to the carrying surface 1214 of the carrying portion 1212, and the power chips 122 are arranged at one side of the transmitting portion 1211. Moreover, the power chips 122 in the instant embodiment are electrically connected to the carrying portion 1212 in parallel.

The circuit layer 13 is disposed on the first surface 111 of the insulating material 11, and the second surface 112 of the insulating material 11 is formed on the carrying surface 1214 of the electrically and thermally conductive carrier 121. The circuit layer 13 is electrically connected to the electrically and thermally conductive carrier 121 and the second electrode layers 1222 of the power chips 122, such that each power chip 122 of the power module 1 can be individually tested through the circuit layer 13 and the electrically and thermally conductive carrier 121.

Specifically, the circuit layer 13 includes a carrier circuit 133 and a plurality of chip circuits 134 arranged apart from the carrier circuit 133. The carrier circuit 133 is connected to the connecting pad 1211a of the transmitting portion 1211, and the chip circuits 134 are respectively connected to the second electrode layers 1222 of the power chips 122.

As shown in FIG. 16, the multi-layer board 2 has a first board surface 21 and an opposite second board surface 22. A surface of each electrically and thermally conductive carrier 121 arranged away from the power chips 122 (i.e., the bottom surface of each electrically and thermally conductive carrier 121 shown in FIG. 16) is exposed from the multi-layer board 2 via the first board surface 21.

Fifth Embodiment

Please refer to FIGS. 17 through 24, which show a fifth embodiment of the instant disclosure. The fifth embodiment is similar to the fourth embodiment, and the identical features are not described. The different features between the two embodiments are the power module 1 and the manufacturing method. The following description discloses a manufacturing method of the circuit board structure 100 of the instant embodiment first for clearly explaining this different feature.

Figure 17:
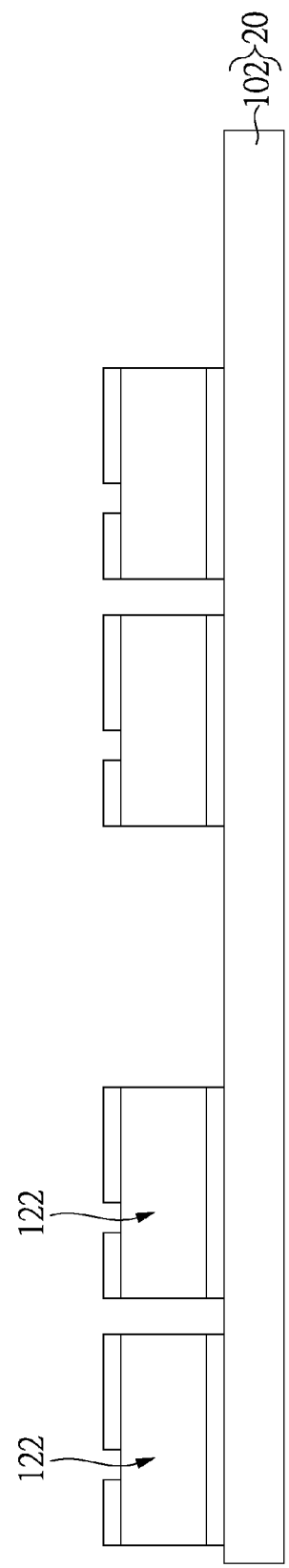
FIG. 17 is a cross-sectional view showing step S210 of a manufacturing method of the circuit board structure according to a fifth embodiment of the instant disclosure.
Figure 22:
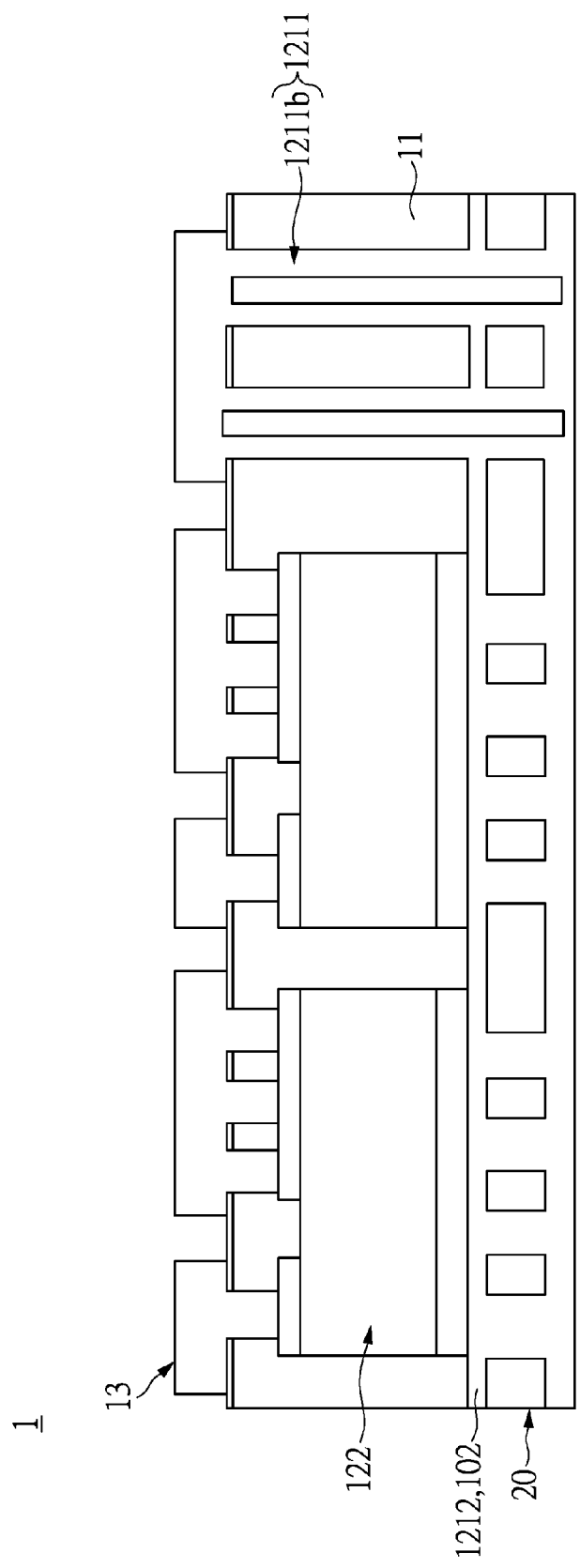
FIG. 22 is a cross-sectional view showing a first variety of the circuit board structure according to the fifth embodiment of the instant disclosure.
Figure 23:
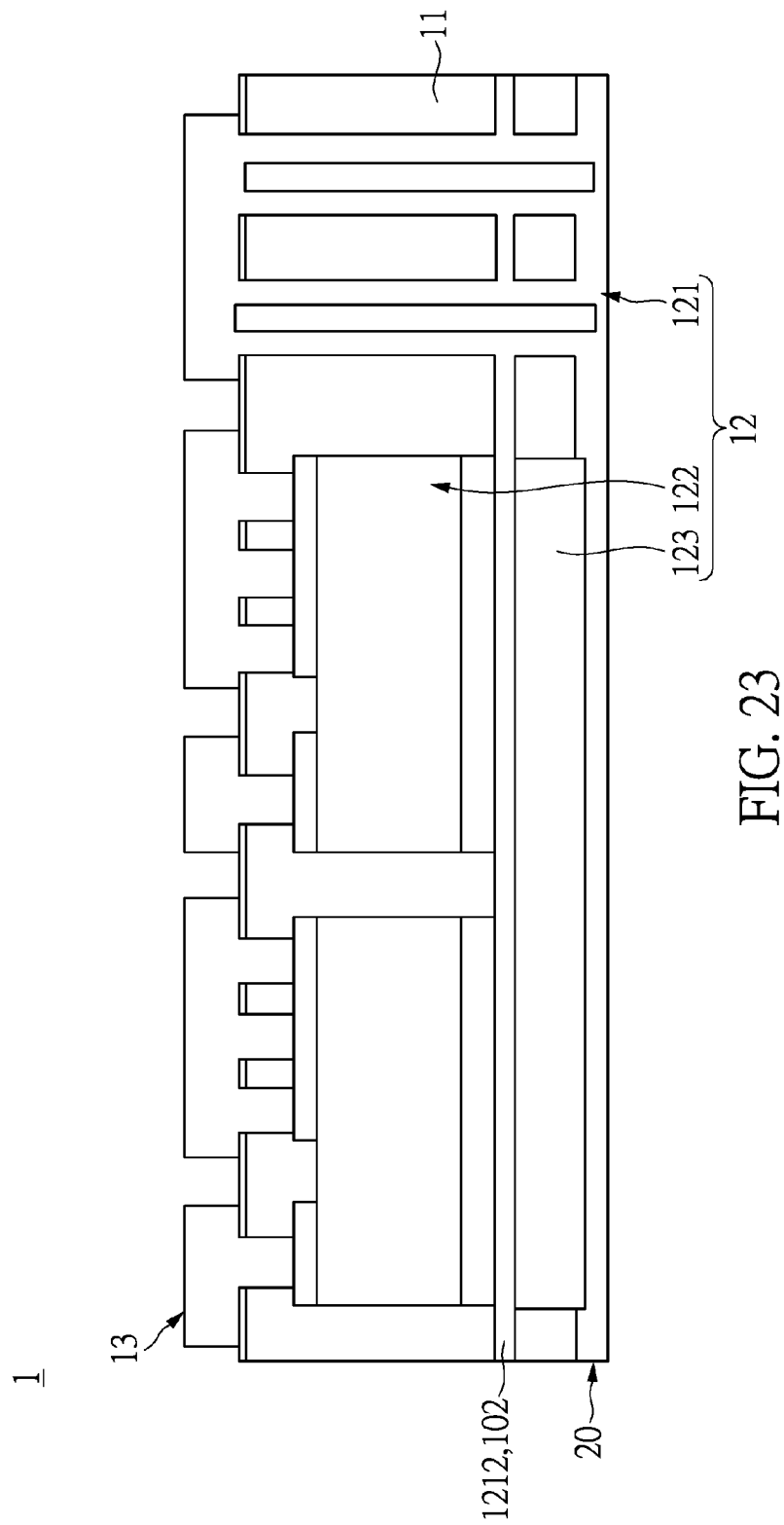
FIG. 23 is a cross-sectional view showing a second variety of the circuit board structure according to the fifth embodiment of the instant disclosure.
Figure 24:
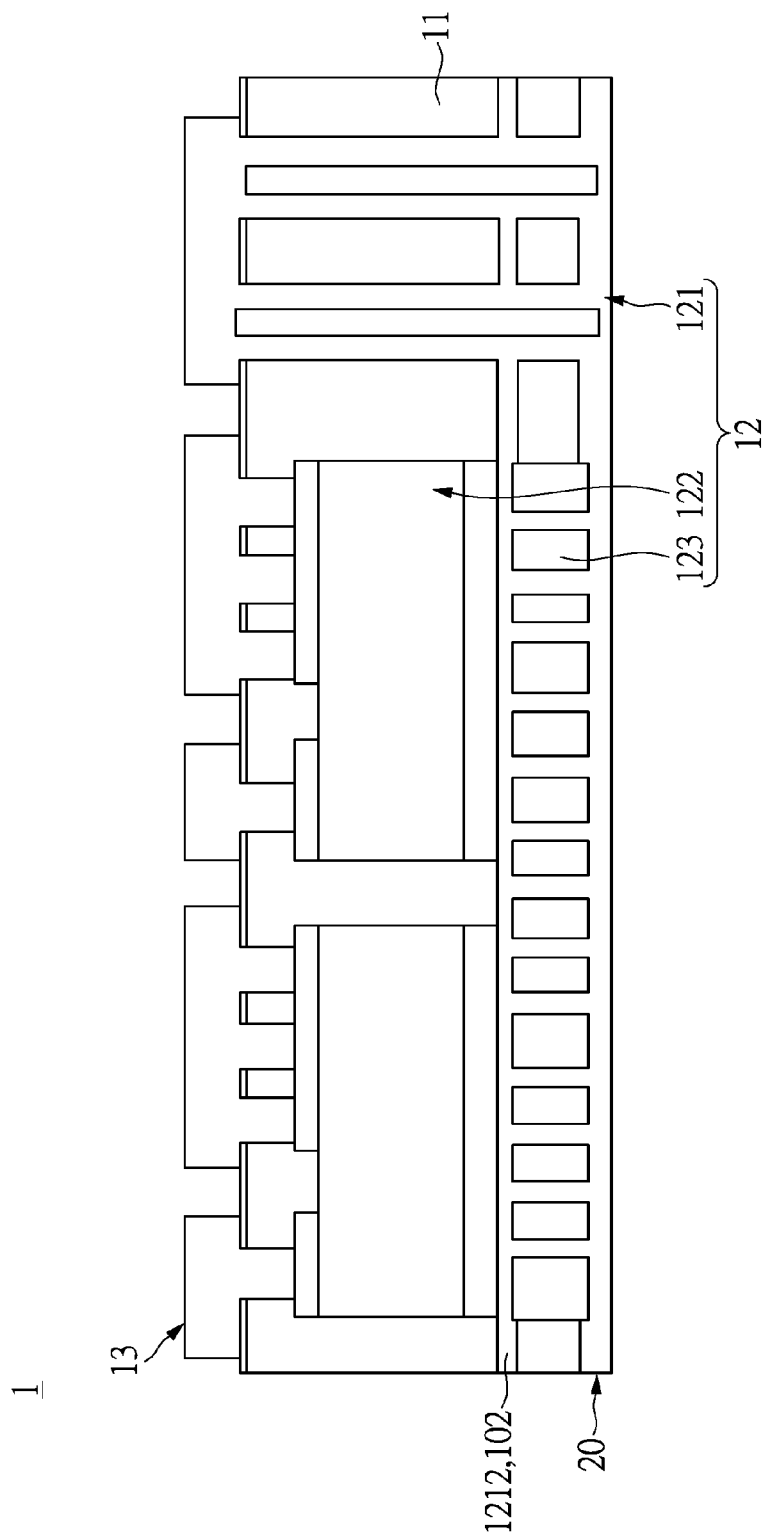
FIG. 24 is a cross-sectional view showing a third variety of the circuit board structure according to the fifth embodiment of the instant disclosure.

Please refer to FIG. 17, which shows a step S210 of the manufacturing method. A plurality of sets of power chips 122 (i.e., each set has two power chips 122) are mounted on a carrying plate 20. The carrying plate 20 has a first metal layer 102, and the sets of the power chips 122 are fixed on and electrically connected to the first metal layer 102. Specifically, the carrying plate 20 can be the first metal layer 102 (as shown in FIG. 17), a circuit board (as shown in FIG. 22), or a circuit board with a ceramic block embedded therein (as shown in FIGS. 23 and 24), but the instant disclosure is not limited thereto.

Figure 18:
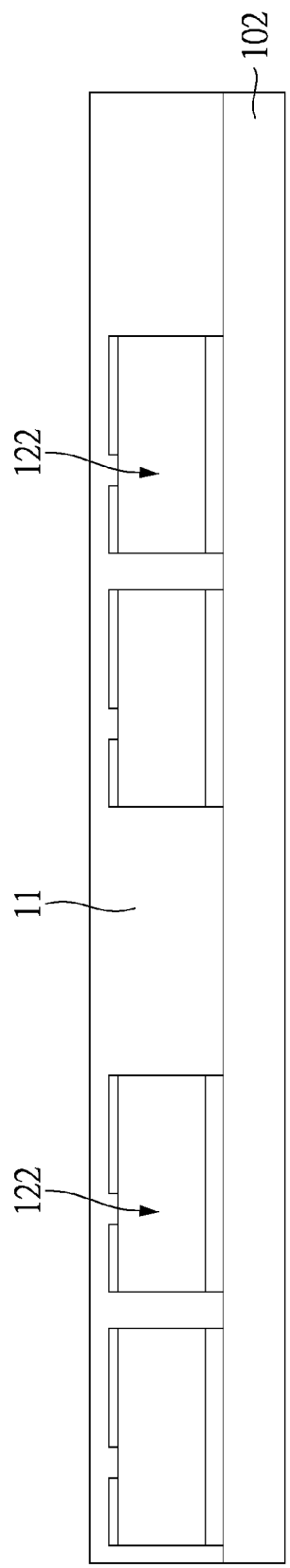
FIG. 18 is a cross-sectional view showing step S220 of the manufacturing method of the circuit board structure according to the fifth embodiment of the instant disclosure.

Please refer to FIG. 18, which shows a step S220 of the manufacturing method. An insulating material 11 is formed on the first metal layer 102 to cover the sets of the power chips 122. The insulating material 11 in the instant embodiment is a molding compound and encapsulates the corresponding power chips 122.

Figure 19:
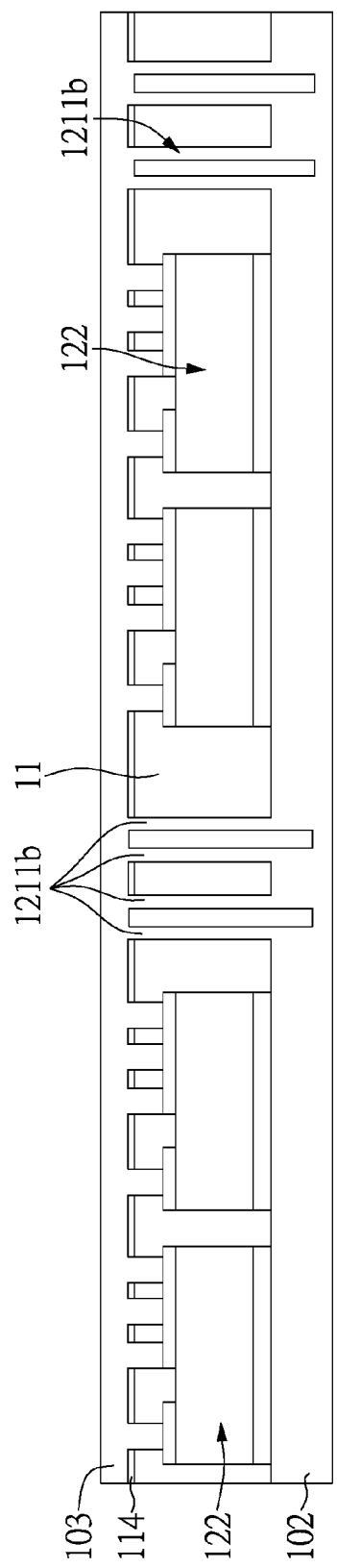
FIG. 19 is a cross-sectional view showing step S230 of the manufacturing method of the circuit board structure according to the fifth embodiment of the instant disclosure.

Please refer to FIG. 19, which shows a step S230 of the manufacturing method. A second metal layer 103 is formed on a surface of the insulating material 11 (i.e., the top surface of the insulating material 11 shown in FIG. 19) arranged away from the first metal layer 102, and a plurality of sets of connecting columns 1211b are formed in the insulating material 11. The second metal layer 103 is electrically connected to the sets of the power chips 122, and the sets of the connecting columns 1211b connect the first metal layer 102 and the second metal layer 103. The sets of the connecting columns 1211b are arranged away from each other and are respectively corresponding in position to the sets of the power chips 122. That is to say, each set of the power chips 122 is arranged close to one of the sets of the connecting columns 1211b. Moreover, the connecting columns 1211b and the second metal layer 103 can be formed by drilling the first metal layer 102 and the insulating material 11 to form a plurality holes, and then filling metal material into the holes.

Figure 20:
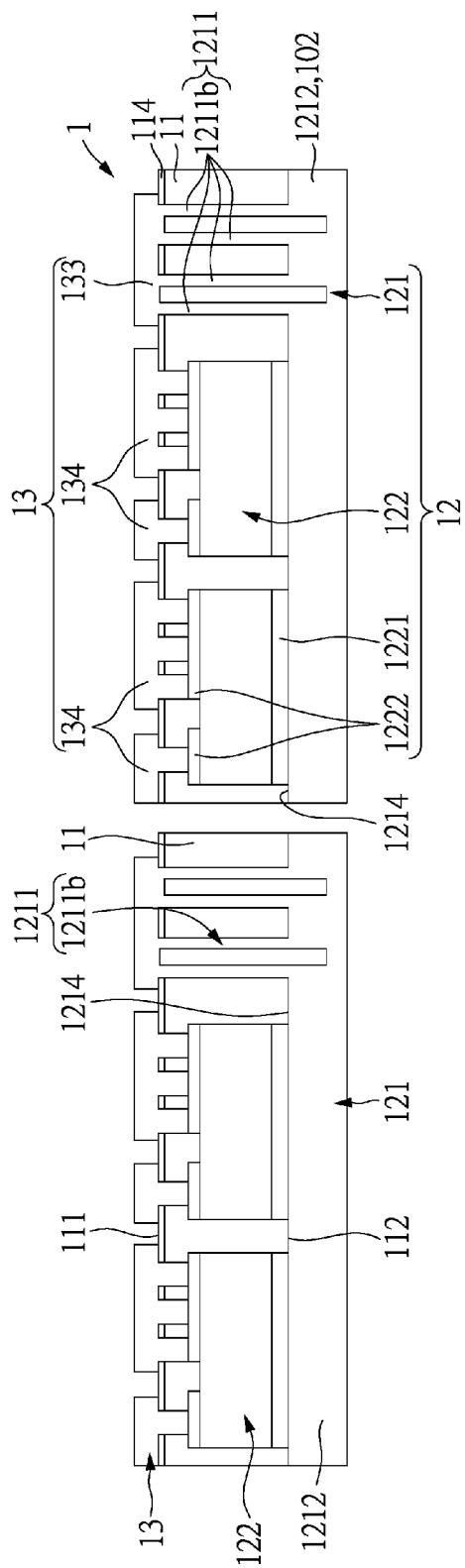
FIG. 20 is a cross-sectional view showing steps S240 and S250 of the manufacturing method of the circuit board structure according to the fifth embodiment of the instant disclosure.

It should be noted that the insulating material 11 in the instant embodiment can be provided with a bonding layer 114 arranged away from the first metal layer 102 for bonding the second metal layer 103, and an outer surface of the bonding layer 114 can be regarded as the first surface 111 of the insulating material 11 (as shown in FIG. 20).

Please refer to FIG. 20, which shows a step S240 of the manufacturing method. The second metal layer 103 is etched to form a plurality of circuit layers 13, and each of the circuit layers 13 is connected to one of the sets of the connecting columns 1211b and the corresponding set of the power chips 122.

Please refer to FIG. 20, which shows a step S250 of the manufacturing method. The insulating material 11 and the carrying plate 20 are sawed to form a plurality of power modules 1. The number of the power modules 1 in the instant embodiment is two for example, but the instant disclosure is not limited thereto. Thus, the power module 1 can be produced in mass by implementing the above steps S210~S150, thereby increasing the producing rate of the power module 1.

In each of the power modules 1, an electrically and thermally conductive carrier 121 includes part of the sawed first metal layer 102 and the connecting columns 1211b connected to the part of the sawed first metal layer 102, a carrying portion 1212 of the electrically and thermally conductive carrier 121 includes the part of the sawed first metal layer 102, and a transmitting portion 1211 of the electrically and thermally conductive carrier 121 includes the connecting columns 1211b connected to the part of the sawed first metal layer 102.

Figure 21:
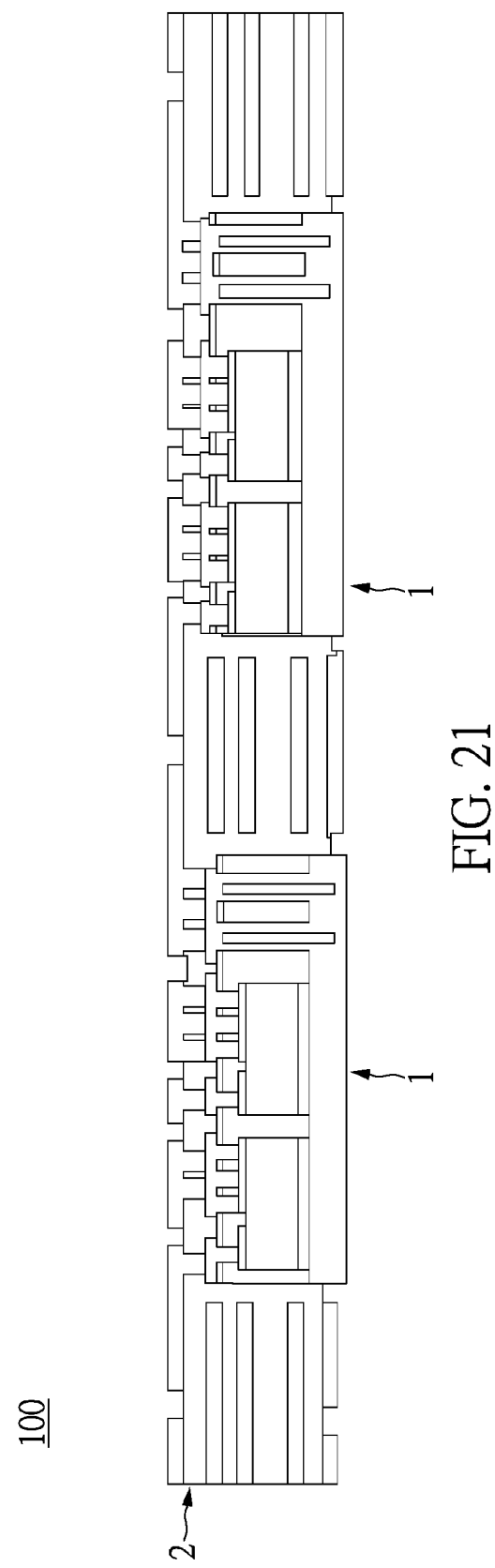
FIG. 21 is a cross-sectional view showing step S260 of the manufacturing method of the circuit board structure according to the fifth embodiment of the instant disclosure.

Please refer to FIG. 21, which shows a step S260 of the manufacturing method. The power chips 122 of each of the power modules 1 are tested to select at least part of the power modules 1 without any defect, and the at least part of the power modules 1 are embedded into a plurality of concavities (not labeled) of a multi-layer board 2 to form a circuit board structure 100 with chips embedded therein. Thus, the circuit board structure 100 of the instant embodiment can be produced by implementing the above steps S210~S260.

The manufacturing method of the circuit board structure 100 of the instant embodiment has been disclosed in the above description, and the following description simply discloses the circuit board structure 100 produced by using the manufacturing method. Part of the circuit board structure 100 of the instant embodiment is identical to that of the first to fourth embodiments, so the identical features can be referenced in the first to fourth embodiments.

As shown in FIG. 21, the circuit board structure 100 includes a multi-layer board 2 and at least one power module 1 embedded in the multi-layer board 2. The number of the at least one power module 1 embedded in the multi-layer board 2 in the instant embodiment is two, but the instant disclosure is not limited thereto. Moreover, the power modules 1 have the same construction, so the following description only describes one of the power modules 1.

As shown in FIG. 20, the power module 1 includes an insulating material 11, a power unit 12 at least partially covered by the insulating material 11, and a circuit layer 13 disposed on the insulating material 11. The insulating material 11 has a first surface 111 and an opposite second surface 112. The power unit 12 includes an electrically and thermally conductive carrier 121 and a plurality of power chips 122 disposed on the electrically and thermally conductive carrier 121.

The electrically and thermally conductive carrier 121 includes a plate-like carrying portion 1212 and a transmitting portion 1211 perpendicularly connected to the carrying portion 1212. The transmitting portion 1211 includes a plurality of connecting columns 1211b perpendicularly connected to the carrying portion 1212 and embedded in the insulating material 11.

Each power chip 122 includes a first electrode layer 1221 and an opposite second electrode layer 1222. Each first electrode layer 1221 in the instant embodiment is a drain electrode, and each second electrode layer 1222 includes a source electrode and a gate electrode arranged apart from the source electrode. The first electrodes 1221 of the power chips 122 are fixed on and electrically connected to the carrying surface 1214 of the carrying portion 1212, and the power chips 122 are arranged at one side of the transmitting portion 1211. Moreover, the power chips 122 in the instant embodiment are electrically connected to the carrying portion 1212 in parallel.

The circuit layer 13 is disposed on the first surface 111 of the insulating material 11, and the second surface 112 of the insulating material 11 is formed on the carrying surface 1214 of the electrically and thermally conductive carrier 121. The circuit layer 13 is electrically connected to the electrically and thermally conductive carrier 121 and the second electrode layers 1222 of the power chips 122, such that each power chip 122 of the power module 1 can be individually tested through the circuit layer 13 and the electrically and thermally conductive carrier 121.

Specifically, the circuit layer 13 includes a carrier circuit 133 and a plurality of chip circuits 134 arranged apart from the carrier circuit 133. The carrier circuit 133 is connected to the connecting columns 1211b of the transmitting portion 1211, and the chip circuits 134 are respectively connected to the second electrode layers 1222 of the power chips 122. Specifically, a portion (i.e., the chip circuits 134) of the circuit layer 13 is connected to the second electrode layers 1222 of the power chips 122 by passing through the insulating material 11.

In addition, the construction of the power module 1 can be adjusted according to a designer's demands. For example, as shown in FIG. 22, the carrying plate 20 in the step 210 can be a circuit board, and the metal layer 102 (or the carrying portions 1212) can be an external copper layer of the circuit board. As shown in FIGS. 23 and 24, the carrying plate 20 in the step S210 can be a circuit board having a ceramic block 123 embedded therein, and the carrying portions 1212 are disposed on the ceramic block 123. Specifically, the ceramic block 123 shown in FIG. 24 is drilled to form a plurality of holes, and the holes are filled with electrically conductive material, so the ceramic block 123 can increase an electrically and thermally transmitting rate of the power module 1.

The descriptions illustrated supra set forth simply the preferred embodiments of the instant invention; however, the characteristics of the instant invention are by no means restricted thereto. All changes, alterations, or modifications conveniently considered by those skilled in the art are deemed to be encompassed within the scope of the instant invention delineated by the following claims.

What is claimed is:

1. A circuit board structure with chips embedded therein, comprising: at least one power module including: an insulating material having a first surface and an opposite second surface; a power unit at least partially covered by the insulating material, and the power unit including: an electrically and thermally conductive carrier having a transmitting portion and a carrying portion perpendicularly connected to the transmitting portion; and a plurality of power chips each having a first electrode layer and an opposite second electrode layer, wherein the first electrode layers are fixed on and electrically connected to the carrying portion in parallel, and the power chips are arranged at one side of the transmitting portion; and a circuit layer disposed on the first surface of the insulating material, wherein the circuit layer is electrically connected to the electrically and thermally conductive carrier and the power chips, so the power chips of the at least one power module are configured to be individually tested through the circuit layer and the electrically and thermally conductive carrier; and a multi-layer board, wherein the at least one power module is embedded in the multi-layer board after testing to ensure that the at least one power module is provided without any defect, wherein the transmitting portion includes a connecting pad connected to the carrier circuit and a plurality of connecting columns connected to the connecting pad and the carrying portion, the power unit includes an insulating support arranged between the connecting pad and the carrying portion, and the connecting columns are embedded in the insulating support.

2. The circuit board structure as claimed in claim 1, wherein the circuit layer has a carrier circuit and a plurality of chip circuits arranged apart from carrier circuit, the carrier circuit is connected to the transmitting portion, and the chip circuits are respectively connected to the second electrode layers of the power chips.

3. The circuit board structure as claimed in claim 1, wherein the transmitting portion is soldered or sintered to the carrying portion.

4. The circuit board structure as claimed in claim 1, wherein a portion of the circuit layer is connected to the second electrode layers of the power chips by passing through the insulating material.

5. The circuit board structure as claimed in claim 1, wherein the power unit includes a ceramic block, and the carrying portion of the electrically and thermally conductive carrier is disposed on the ceramic block.

6. The circuit board structure as claimed in claim 1, wherein each of the first electrode layers includes a drain electrode, each of the second electrode layers includes a source electrode and a gate electrode arranged apart from the source electrode.

7. The circuit board structure as claimed in claim 1, wherein each of the power chips is a high-power chip, at least one electrically conductive layer is embedded in the insulating material and is provided without contacting the electrically and thermally conductive carrier and the power chips.

* * * * *